United States Patent

Gratzel et al.

Patent Number: 5,084,365
Date of Patent: Jan. 28, 1992

[54] PHOTO-ELECTROCHEMICAL CELL AND PROCESS OF MAKING SAME

[76] Inventors: Michael Gratzel, chemin du Marquisat 7a, CH-1050 Sts. Sulpice; Paul Liska, chemin des Bossons 47, CH1018 Lausanne, both of Switzerland

[21] Appl. No.: 475,023

[22] Filed: Feb. 5, 1990

Related U.S. Application Data

[62] Division of Ser. No. 255,052, Oct. 7, 1988, Pat. No. 4,927,721.

[30] Foreign Application Priority Data

Feb. 12, 1988 [CH] Switzerland .................. 00505/88

[51] Int. Cl.$^5$ .............................................. H01M 6/36
[52] U.S. Cl. ................................................ 429/111
[58] Field of Search ...................................... 429/111

[56] References Cited

U.S. PATENT DOCUMENTS

H626  4/1989  Covino .

FOREIGN PATENT DOCUMENTS 0117755  9/1984  European Pat. Off. ............ 423/593
143825  6/1987  Japan .................................. 423/593
265120  11/1987  Japan .................................. 423/593

OTHER PUBLICATIONS

P. M. Ibrahim et al., "Preparation of Lead Zirconate by a Sol-Gel Method", *Trans. J. Br. Ceram.*, Soc., 80 (1981), 18–22.

Primary Examiner—Wayne A. Langel

[57] ABSTRACT

The regenerative photo-electrochemical cell comprises a polycrystalline metal oxide semiconductor layer having a substantially monomolecular chromophore layer in a surface zone. The surface of the metal oxide semiconductor layer has a roughness factor of more than 20, preferably more than 200. Photo-electrochemical cells having such metal oxide semiconductors have good monochromatic efficiency using redox systems with iodides or bromides.

10 Claims, 2 Drawing Sheets

PHOTO-ELECTROCHEMICAL CELL AND PROCESS OF MAKING SAME

This is a division of application Ser. No. 07/255,052, filed Oct. 7, 1988, now U.S. Pat. No. 4,927,721.

This invention relates to a photo-electrochemical cell and to a process of making the same.

As is known, photo-electrochemical cells constructed of semiconductor/electrolyte boundary layers have photo-electrochemical properties similar to those of the Schottky barrier of semiconductor/metal boundary layers. However, semiconductors having closely spaced conduction and valence bands in which the charge carriers of the semiconductor itself are photo-electrically excited with light, as is the case, for example, with silicon, gallium-arsenide, and cadmium sulphide, are photo-corrosively decomposed under light irradiation with the use of electrolytes.

Regenerative photo-electrochemical cells with stable metal oxide semiconductors have a poor yield when irradiated with light, particularly sunlight, since there is a relatively large distance between the valence band and the conduction band (3 eV $\approx$ 400 nm). Further, light absorption is restricted to light in the violet and ultraviolet range in the case of metal oxide semiconductors. Thus, while the metal oxide semiconductors are substantially transparent to light, they would be chemically stable and resistant when subjected to light irradiation using electrolytes.

The sensitivity, i.e., the photo-electrochemical yield for visible light, and hence also for sunlight, can be increased by chemically adding or incorporating (chemisorbing) chromophores, also known as sensitizers or dyes, as charge carriers on the surface of a semiconductor. In such a case, the two functions of light absorption and charge carrier separation are then separated. The light absorption is carried out by the chromophore in the surface zone and the separation of the charge carriers takes place at the semiconductor/chromophore boundary layer. However, in such electrochemical systems with metal oxide semiconductors having a smooth surface, the yield in the maximum of the absorption spectrum (ELECTRICAL ENERGY GENERATED as a percentage of INCIDENT PHOTON ENERGY) is at most only in the region of just a few tenths of a percent, for example, in the range of 0.1 to 0.2%.

Accordingly, it is an object of this invention to provide a durable regenerative photo-electrochemical cell whose polycrystalline metal oxide semiconductor does not corrode and which has an improved electrical energy yield in the light spectrum range, more particularly the sunlight spectrum.

It is another object of the invention to provide a simple process for the production of metal oxide semiconductors of relatively high efficiency in the conversion of sunlight to electrical energy.

It is another object to improve the efficiency of a regenerative photo-electrochemical cell.

It is another object of the invention to provide a solar cell having a relatively high efficiency.

Briefly, the invention provides a regenerative photo-electrochemical cell having a polycrystalline metal oxide semiconductor with a surface having a roughness factor of more than 20 and more than 150, for example, about 200, and a monomolecular chromophore layer on the surface of the semiconductor. The roughness is defined as the ratio of an actual/effective surface to the projected area of that surface of a body, i.e., in the present case, the photo-electrochemically active surface of the metal oxide semiconductor.

The invention also provides a process of making an improved regenerative photo-electrochemical cell with a polycrystalline metal oxide semiconductor. In this respect the process employs the SOL-GEL process (described in detail, for example, in Stalder und Augustynski, J. Electrochem. Soc. 1979, 126, 2007) and maintains the percentage relative humidity of the ambient atmosphere in a metal alcoholate hydrolysis step of the process within a range of 30% to 80% and is kept constant within plus or minus 5%, preferably plus or minus 1%. The process produces metal oxide semiconductor layers with which a very high electrochemical yield can be obtained in photo-electrochemical cells. A monochromatic efficiency of 14% can be obtained particularly with a titanium oxide layer of this kind produced at a relative humidity in the range of 48%, the efficiency denoting the electrical power in the optimal point as a percentage of the incident light energy.

The invention also provides a solar cell comprised of the polycrystalline metal oxide semiconductor layer having a photo-electrochemically active surface with a roughness factor of more than 20, a monomolecular chromophore layer on the active surface, an electrolyte layer on the chromophore layer and an electrode on the electrolyte layer.

The rough surface with a polycrystalline structure offers an area greater by the roughness factor for a monomolecular surface layer of the chromophore. Consequently, the light incident on an area of a specific size is converted to electrical energy with a considerably greater yield. The metal oxide semiconductor layer can be regarded as transparent to the incident light flux. However, light is partially reflected on the surface and partly reaches adjacent surfaces. The light penetrating the metal oxide semiconductor layer and light not absorbed and converted by the monomolecular chromophore layer encounters chromophore molecules on the exit side partly directly and partly indirectly, after total reflection on the surface, so that a considerably higher light yield can be obtained.

Different chromophores have different spectral sensitivities. The choice of chromophore can thus be adapted to the spectral composition of the light of the light source in order to increase the yield as far as possible.

Particularly suitable metal oxide semiconductors are oxides of the transition metals, and of elements of the third main groups and of the fourth, fifth and sixth secondary group (of the periodic system of elements) of titanium, zirconium, niobium, tantalum, chromium, molybdenum, tungsten, or alternatively oxides of zinc, iron, nickel or silver, perovskites such as $SrTiO_3$, $CaTiO_3$ or oxides of other metals of the second and third main groups or mixed oxides or oxide mixtures of these metals. Alternatively, any other conductive metals oxide with semiconductor properties and a large energy gap (band gap) between the valency band and the conductivity ban can be used.

Examples of suitable chromophores, i.e., sensitizers, are complexes of transition metals of the type metal ($L_3$), ($L_2$) of ruthenium and osmium (e.g., ruthenium tris (2,2'bipyridyl-4,4'dicarboxylate), ruthenium cis - diaqua bipyridyl complexes, such as ruthenium cis diaqua bis (2,2'bipyridyl-4,4'dicarboxylate) and porphyrins (e.g.

zinc tetra (4-carboxyphenyl) porphyrin) and cyanides (e.g. iron-hexacyanide complexes) and phthalocyanines.

The chromophores may be chemi-sorbed, adsorbed or otherwise be permanently added in the region of the surface of the metal oxide semiconductor. Favourable results are obtained, for example, with chromophores bonded to the surface of the metal oxide semiconductor by carboxylic acid ligands instead of ester ligands.

Examples of an electrolyte for such photoelectrochemical cells are iodide, bromide, hydroquinone or other redox systems. Because of their redox potential, these electrolytes act as pure relay substances for the charge transport. Examples of suitable redox systems are approximately $10^{-2}$M solutions of such redox systems with 1 mM $HClO_4$ as electrolyte supporting the charge transport.

The SOL-GEL process will be described hereinafter with reference to an example relating to the production of a titanium oxide layer ($TiO_2$) having a high roughness factor on a titanium substrate.

The titanium substrate consisting of pure titanium of about 99.5% purity is first cleaned for about 30 minutes in approximately 18% boiling HCl. A titanium-ethoxide solution is obtained, for example, by dissolving 21 mMol $TiCl_4$ in 10 ml of pure ethanol (puriss.). This solution is then diluted with very pure methanol (puriss.) to give a titanium concentration in the range of about 25 to 50 mg/ml. A drop of the solution is applied to the titanium substrate and the resulting titanium alkoxide is hydrolyzed at room temperature for about 30 minutes at a humidity of 48% plus or minus 1%. The substrate is then heated with the hydrolyzed layer for about 15 minutes at about 450° C. This process is repeated several times. The process is further described in N. Vlachopoulos, et al, Efficient Spectral Sensitisation of Polycrystalline Titanium Dioxide Photoelectrodes, Surface Science 189/190 (1987) North-Holland Amsterdam, pp. 823-831.

After being repeated ten to fifteen times, the $TiO_2$ layer reaches a thickness of about 20μ. The substrate with the layer is then heated at about 550° C. for about 30 minutes in a pure argon atmosphere (e.g. 99.997%). The $TiO_2$ layer prepared in this way has a roughness factor in the range of 200. Such metal oxide semiconductor layers (of other metals as well) can be produced on other substrates by similar methods.

The chromophore, e.g., $RuL_3{}^{4-}$, is applied by immersing the substrate with the oxide layer in an aqueous solution of $2 \times 10^{-4}$M $RuL_3{}^{4-}$, having a pH of about 3.5, for about 1 hour (pH adjusted with dilute HCl). Other chromophores can be applied to titanium oxide or other metal oxide semiconductors by similar processes.

These and other objects and advantages of the invention will become more apparent from the following detailed description taken in conjunction with the accompanying drawings wherein.

Figure 3:
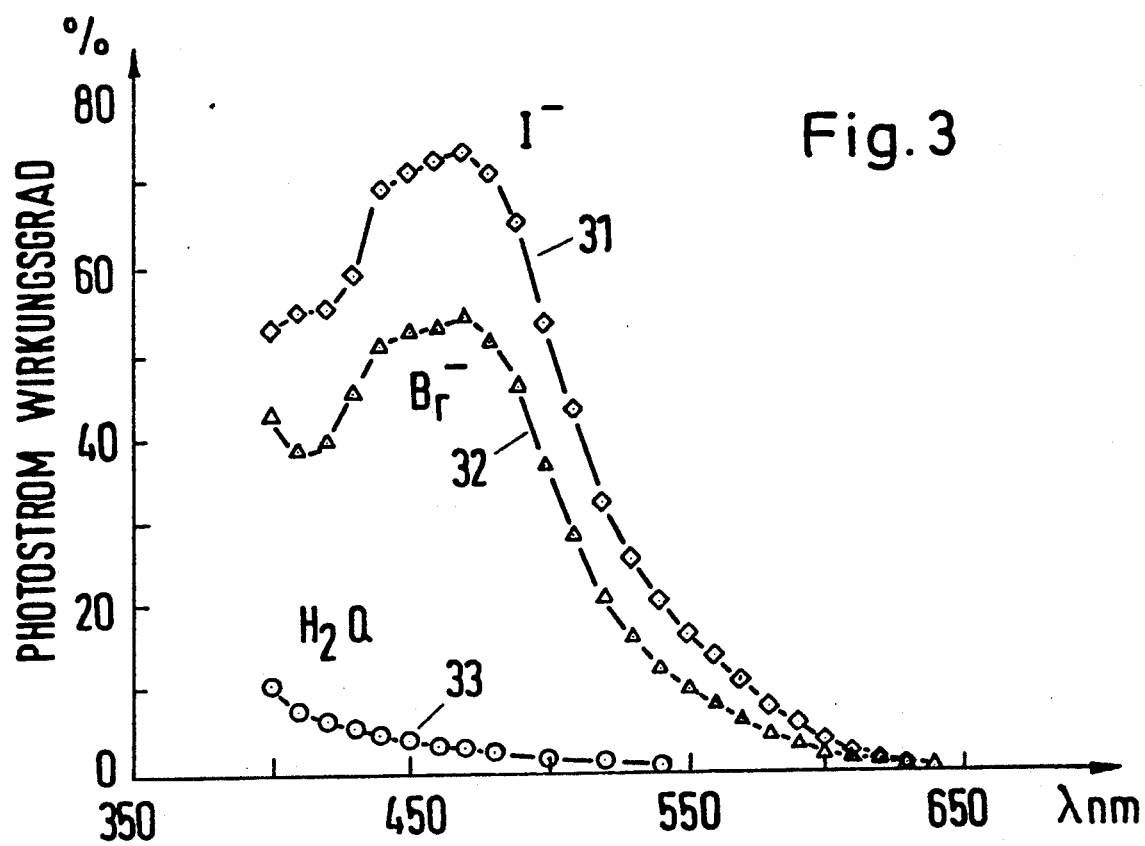
Figure 4:
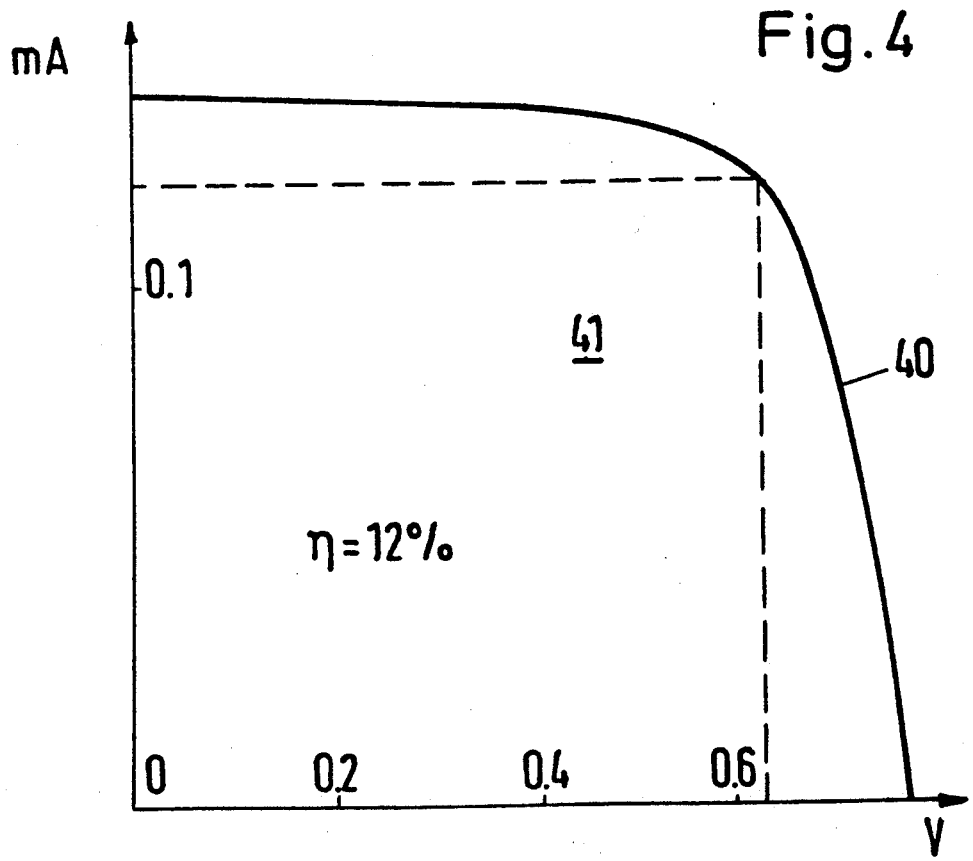

FIG. 3 graphically illustrates the photocurrent efficiency as a percentage of the incident light flux against the wavelength of the light for a titanium oxide with $RuL_3{}^{4-}$ as chromophore and using different electrolytes; and FIG. 4 graphically illustrates the photocurrent/voltage characteristic of a photo-electrochemical cell with $RuL_3{}^{4-}$ coated titanium oxide for incident light of 470 nm wavelength.

Figure 1:
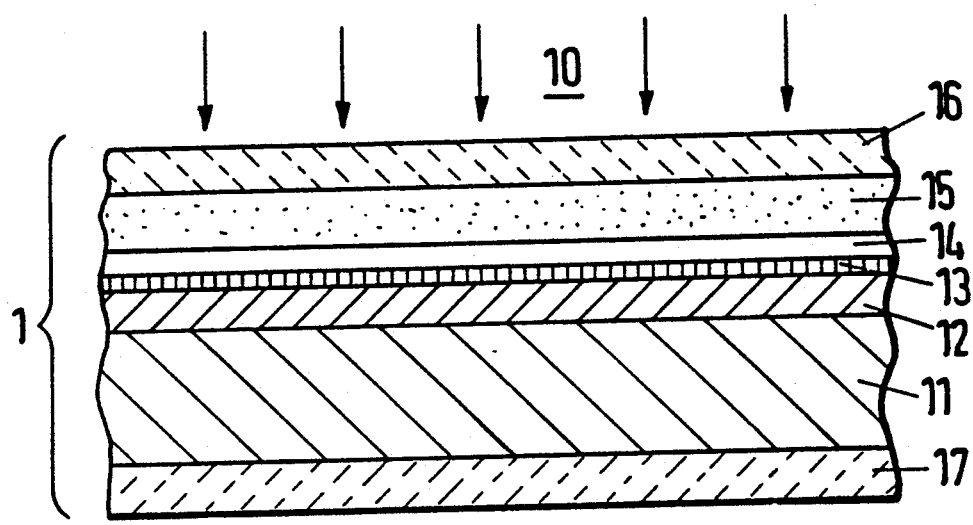
FIG. 1 illustrates a diagrammatic cross-sectional view of a photo-electrochemical cell with a chromophore-coated metal oxide semiconductor layer according to the invention.

Referring to FIG. 1, (not to scale) the photoelectric cell comprises a metal support 11, to which there is applied a metal oxide semiconductor layer 12, for example of titanium oxide, having a high roughness factor of, for example, 200 and a thickness of about 20μu. A monomolecular layer of sensitizer or chromophore (dye) 13, for example $RuL_3{}^{4-}$, is disposed on the surface of the semi-conductor layer 12 and adjoins an electrolyte layer 14, which on the other side adjoins a conductive electrode 15 consisting, for example, of conductive glass or plastic. The cell 1 is closed at the top and bottom by an insulating layer 16, 17, respectively.

The conductive electrode 15 and the insulating layer 16 must be transparent to the light 10 so that the light can reach the chromophore for conversion to electrical energy. The lateral termination (not shown) of a cell 1 of this kind may be a frame of electrically insulating material, e.g., plastic or glass.

Figure 2:
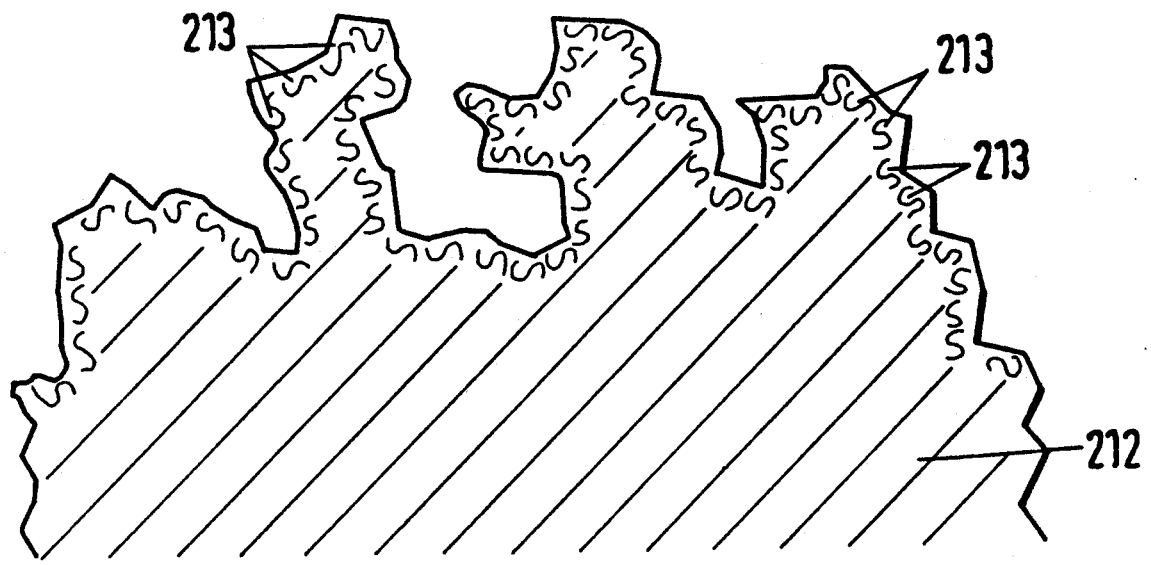
FIG. 2 illustrates a diagrammatic section through a metal oxide semiconductor with a monomolecular chromophore layer.

FIG. 2 is a highly enlarged diagram of a metal oxide semiconductor layer 212 having a high roughness factor, with the monomolecular layer of chromophore molecules 213 disposed in the surface zone. This monomolecular layer may, for example, consist of adsorbed chemisorbed chromophore molecules 213. Atoms or molecules may initially be doped into the surface layer of the metal oxide semiconductor and the chromophore molecules be built up there around.

FIG. 3 illustrates two curves showing the percentage of photochemically generated current of a photo-electrochemical cell with $TiO_2$ as metal oxide semiconductor and $RuL_3{}^{4-}$ as chromophore, with respect to the incident light flux for different wavelengths and for different electrolytes. The y-axis shows the percentage photocurrent efficiency and the x-axis the wavelength of the incident light in nm. The basic electrolyte used was an aqueous solution of $HClO4$ ($10^{-3}$M (molar)) as electron donator. In the series of measurements forming the basis of curve 31, $RuL_3{}^{4-}$ coated $TiO_2$ was used and as an additional electrolyte 1M KI. In the series of measurements on which curve 32 is based, $RuL_3{}^{4-}$ coated $TiO_2$ was used and as an additional electrolyte 0.1M NaBr. For comparison, curve 33 shows a series of measurements in which $TiO_2$ was used without a chromophore and 10 μM hydroquinone was used as an additional electrolyte.

FIG. 4 shows a photocurrent/voltage curve 40 (characteristic) of a regenerative photo-electrochemical cell with an $RuL_3{}^{4-}$ coated $TiO_2$ metal oxide semiconductor as photo-anode and a platinum companion electrode. The y-axis shows the current of the cell in milliamps and the x-axis the voltage in volts. The cell area is 4 square centimeters ($cm^2$). The light incident on the cell has an area-specific power of 1.58 watts per square meter ($W/m^2$). The cell is thus irradiated with 0.632 mW light. The electrolyte contains $10^{-3}$M $HClO_4$, 1M LiBr and $10^{-3}$M Br . The wavelength of the exciting light is 460 nm. The space factor 41 (represented by the area of the rectangle having the two broken-line sides) is 0.74 and is in the range of cells with monocrystalline silicon. (The space factor of a cell equals the maximum output power divided by the product of the short circuit current times the voltage on the open circuit).

That is:

$$\text{space factor} = \frac{\text{maximum output power}}{\text{short circuit current} \times \text{voltage on open circuit}}$$

The monochromatic efficiency of this cell is 12% and is defined as (power at—optimal point×100)/(incident light energy).

The invention thus provides a regenerative photo-electrochemical cell which is able to convert sunlight to electrical energy at relatively high efficiency rates and which is capable of use as a solar cell.

The invention also provides a process of making a regenerative photo-electrochemical cell of high efficiency in converting sunlight to electrical energy.

What is claimed is:

1. In a SOL-GEL process of making a regenerative photo-electrochemical cell with a polycrystalline metal oxide semi-conductor, the steps of
   forming a layer of metal alcoholate on a metal substrate;
   hydrolyzing the metal alcoholate in an ambient temperature having a percent relative humidity in the range of from 30% to 80%
   heating the substrate and hydrolyzed layer;
   repeating said steps to obtain a metal oxide layer; and
   thereafter heating the substrate and metal oxide layer to obtain a semiconductor metal oxide layer with a roughness factor of at least 20.

2. A process as set forth in claim 1 wherein the relative humidity is kept constant within plus or minus 5%.

3. A process as set forth in claim 1 wherein the relative humidity is kept constant within plus or minus 1%.

4. A process as set forth in claim 1 wherein the relative humidity is kept constant within the range of from +6% to 50%.

5. A process as set forth in claim 4 wherein the humidity is kept constant within the range of from 47% to 49%.

6. A process as set forth in claim 1 wherein the metal substrate is of a metal selected from the group consisting of transition metals and elements of the third main group and of the fourth, fifth and sixth secondary groups.

7. A process as set forth in claim 1 wherein the metal substrate is of a metal selected from the group consisting of titanium, zirconium, hafnium, strontium, zinc, indium, yttrium, lanthanum, vanadium, niobium, tantalum, chromium, molybdenum and tungsten.

8. A process comprising the steps of
   cleaning a titanium substrate in hydrochloric acid;
   dissolving titanium tetrachloride in pure ethanol to obtain a titanium-ethoxide solution;
   adding pure methanol to said solution to dilute said solution to give a titanium concentration in a range of about 25 to 50 mg/ml;
   thereafter applying the diluted solution to the cleaned substrate to obtain a layer of titanium alkoxide;
   hydrolyzing the titanium alkoxide at room temperature and at a relative humidity in a range of 48% plus or minus 1%;
   heating the substrate and hydrolyzed layer for about 15 minutes at about 450° C.;
   repeating said steps of applying the diluted solution, hydrolyzing the resulting layers and heating the hydrolyzed layers to obtain a titanium oxide layer; and
   thereafter heating the substrate and titanium oxide layer in a pure argon atmosphere at about 550° C. for about 30 minutes to obtain a semiconductor titanium oxide layer with a roughness factor of about 200.

9. A process as set forth in claim 8 which further comprises the step of applying a chromophore to said oxide layer.

10. A process as set forth in claim 8 wherein said relative humidity is kept constant in said range.

* * * * *

UNITED STATES PATENT AND TRADEMARK OFFICE
CERTIFICATE OF CORRECTION

PATENT NO. : 5,084,365

DATED : January 28, 1992

INVENTOR(S) : Gratzel et al.

It is certified that error appears in the above-identified patent and that said Letters Patent is hereby corrected as shown below:

Column 2, line 53, change "secondary group" to --secondary groups--

2, line 54, change "zirconium, niobium" to --zirconium, hafnium, strontium, zinc, indium, yttrium, lanthanum, vanadium, niobium--

2, lines 59 and 60, change "metals oxide" to --metal oxide--

2, line 61, change "valency band" to --valence band--

2, line 68, change "(e.g." to --(e.g.,--

Column 3, line 2, change "(e.g." to --(e.g.,--

3, line 43, change "(e.g. 99.997%)" to --(e.g., 99.997%)--

UNITED STATES PATENT AND TRADEMARK OFFICE
CERTIFICATE OF CORRECTION

PATENT NO. : 5,084,365

DATED : January 28, 1992

INVENTOR(S) : Gratzel et al.

It is certified that error appears in the above-identified patent and that said Letters Patent is hereby corrected as shown below:

Column 4, lines 9 and 10, change "example of" to --example, of--

4, line 11, change "20uµ" to --20µ--

4, line 13, change "for example" to --for example,--

4, line 14, change "semi-conductor" to --semiconductor--

4, line 33, change "molecules be" to --molecules may be--

4, line 42, change "HC104" to --HClO$_4$--

4, line 62, change "Br." to --Br$_2$.--

Column 5, line 19, change "semi-conductor" to --semiconductor--

Signed and Sealed this

Thirty-first Day of August, 1993

Attest:

BRUCE LEHMAN

Attesting Officer

Commissioner of Patents and Trademarks